(12) United States Patent
Ward et al.

(10) Patent No.: US 7,857,509 B2
(45) Date of Patent: Dec. 28, 2010

(54) TEMPERATURE SENSING ARRANGEMENTS FOR POWER ELECTRONIC DEVICES

(75) Inventors: Terence G. Ward, Redondo Beach, CA (US); Edward P. Yankoski, Corona, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 655 days.

(21) Appl. No.: 11/758,781

(22) Filed: Aug. 22, 2007

(65) Prior Publication Data

US 2009/0052210 A1    Feb. 26, 2009

(51) Int. Cl.
*G01K 7/22* (2006.01)
*G05D 23/00* (2006.01)

(52) U.S. Cl. ...................... 374/152; 438/135
(58) Field of Classification Search ................ 700/300, 700/299; 363/56.01; 374/145, 152, 178, 374/179; 257/133, E21.388, E29.211; 438/133, 438/135
See application file for complete search history.

(56) References Cited

U.S. PATENT DOCUMENTS

| | | | | |
|---|---|---|---|---|
| 3,794,950 A | * | 2/1974 | Kilner | 338/23 |
| 4,196,361 A | * | 4/1980 | Nakata | 307/117 |
| 5,726,481 A | * | 3/1998 | Moody | 257/467 |
| 5,895,974 A | | 4/1999 | Eytcheson et al. | |
| 6,323,518 B1 | * | 11/2001 | Sakamoto et al. | 257/330 |
| 6,724,313 B2 | * | 4/2004 | Sato et al. | 340/590 |
| 6,759,964 B2 | * | 7/2004 | Sato et al. | 340/590 |
| 7,046,155 B2 | * | 5/2006 | Sato et al. | 340/590 |
| 7,386,243 B2 | * | 6/2008 | Kinouchi et al. | 399/69 |
| 7,710,704 B2 | * | 5/2010 | Haerle et al. | 361/103 |
| 2006/0215341 A1 | * | 9/2006 | Sakurai et al. | 361/100 |
| 2007/0212091 A1 | * | 9/2007 | Kinouchi et al. | 399/69 |
| 2008/0101013 A1 | | 5/2008 | Nelson et al. | |

FOREIGN PATENT DOCUMENTS

| | | |
|---|---|---|
| DE | 19812921 A1 | 9/1999 |
| EP | 0735351 A1 | 10/1996 |
| EP | 0887633 A1 | 12/1998 |
| EP | 1564404 A1 | 8/2005 |

OTHER PUBLICATIONS

Office Action dated Dec. 15, 2009, for German Patent Application No. 102008026541 filed Jun. 3, 2008.

* cited by examiner

*Primary Examiner*—Charles R Kasenge
(74) *Attorney, Agent, or Firm*—Ingrassia Fisher & Lorenz, P.C.

(57) ABSTRACT

A cooling system is provided for controlling temperature in a power electronic device. The power electronic device includes a semiconductor having a major surface. The cooling system includes a temperature sensor coupled to the major surface of the semiconductor; and a control circuit coupled the temperature sensor. The control circuit is configured to reduce current to the inverter circuit when the temperature exceeds a predetermined temperature.

11 Claims, 8 Drawing Sheets

TEMPERATURE SENSING ARRANGEMENTS FOR POWER ELECTRONIC DEVICES

TECHNICAL FIELD

The present invention relates to temperature sensing arrangements for power electronic devices. More particularly, the present invention relates to a cooling system for controlling the temperature of a power electronic device used to supply power to electric motors, such as AC electric motors utilized to drive vehicles.

BACKGROUND OF THE INVENTION

Insulated gate bipolar transistors (IGBTs) are semiconductor devices particularly suitable for use in power applications. IGBTs handle both high voltages and high currents with small die sizes and with relatively low "on" resistance. In addition, IGBTs can be switched rapidly, thereby making IGBTs useful as switches in three phase inverters for high power, alternating current motor applications, such as motors used to drive electric, hybrid and fuel cell vehicles.

When providing alternating current to power hybrid and fuel cell vehicles, IGBTs are arranged in modules with each module having a plurality of IGBTs, for example, six IGBTs. Each IGBT generates heat when operating, and care should be taken to assure that the temperature of the IGBT does not become excessive.

Accordingly, it is desirable to provide a cooling system for controlling temperature in a power electronic device. In addition, it is desirable to provide a system for monitoring temperature in at least one power electronic device providing alternating current to an AC motor of an automotive vehicle. It is further desirable to provide a substrate assembly that prevents excess temperatures from occurring. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A cooling system is provided for controlling temperature in a power electronic device. The inverter circuit includes a semiconductor having a major surface. The cooling system includes a temperature sensor coupled to the major surface of the semiconductor; and a control circuit coupled the temperature sensor. The control circuit is configured to reduce current to the inverter circuit when the temperature exceeds a predetermined temperature.

A system is provided for monitoring temperature in at least one power electronic device providing alternating current to an AC motor of an automotive vehicle. The at least one power electronic device includes a semiconductor having a major surface, at least a portion of which is exposed. The system includes at least one base coupled to the exposed portion of the major surface of the semiconductor. A thermistor is electrically mounted on and electrically connected to the at least one base. A power control circuit is electrically connected to the thermistor for providing DC current to the semiconductor. The power control circuit reduces current to the semiconductor when the semiconductor exceeds a predetermined temperature.

A substrate subassembly includes a ceramic wafer having first and second opposed metallized major faces; a first metal tab on the first metallized face that extends away from the ceramic wafer for electrical connection to a first terminal member; a semiconductor switching device electrically conductively bonded to the first metallized face; and a first ceramic layer bonded to a portion of the first metallized face adjacent the semiconductor switching device. The first ceramic layer includes a metallized upper surface. The substrate subassembly further includes a second metal tab on the metallized upper surface of the first ceramic layer that extends away from the ceramic wafer for electrical connection to a second terminal member; and a first metal layer conductively bonded to electrodes on an upper surface of the switching device and also to the metallized upper surface of the first ceramic layer. The substrate subassembly further includes a second ceramic layer bonded to the first metal layer and being disposed over the semiconductor switching device; and a second metal layer bonded to the second ceramic layer. A temperature sensor is coupled to the second ceramic layer. The temperature sensor is configured to measure the temperature of the semiconductor switching device.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
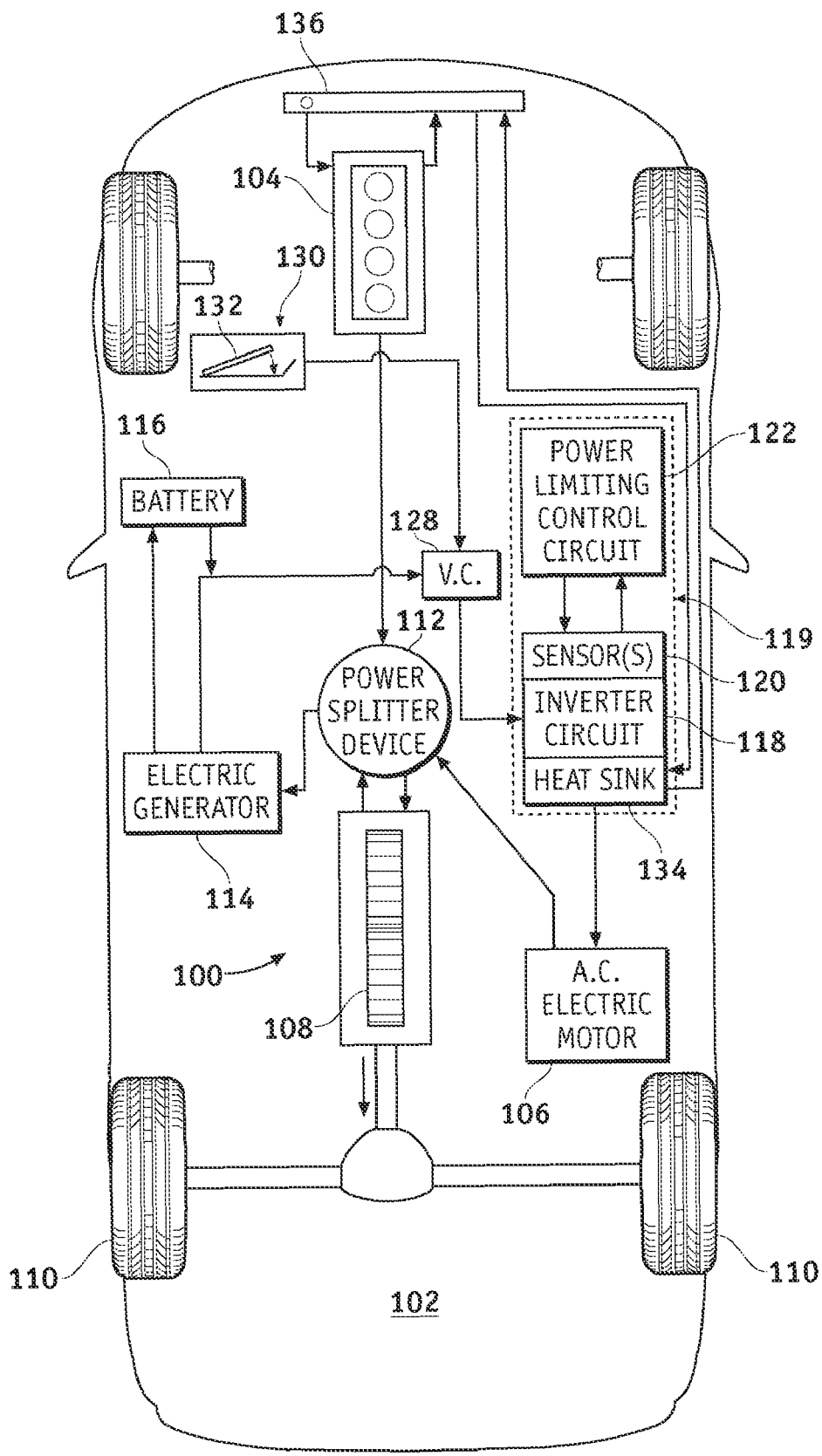
FIG. 1 is a schematic view of an automotive vehicle in accordance with one embodiment of the present invention.

FIG. 1 is an exemplary vehicle 102 with an IC engine-electric hybrid drive 100. The hybrid drive 100 includes an internal combustion engine 104 and a three-phase, alternating current (AC) electric motor 106 to drive the wheels 110 of the vehicle 102. A transmission 108 is disposed between the internal combustion engine 104 and the AC electric motor 106 for transmitting the mechanical output of the internal combustion engine 104 and the AC electric motor 106 to the wheels 110. An electric generator 114 is coupled to and provides direct current to a power electronic device such as an inverter circuit 118. The inverter circuit 118 receives the direct current from the electric generator 114 and provides alternating current to the AC electric motor 106. The electric generator 114 is also coupled to and charges a battery 116, bank of batteries or bank of capacitors. The electric generator 114 is further coupled to receive power from the internal combustion engine 104 or the AC electric motor 106. A vehicle controller 128 is disposed between the electric generator 114 and the inverter circuit 118 for controlling the current to the inverter circuit 118.

A power splitter device 112 is disposed between the internal combustion engine 104 and the AC electric motor 106 and the transmission 108, as well as between the AC electric motor 106 and the transmission 108 and the electric generator 114. The power splitter device 112 determines whether the internal combustion engine 104 or the AC electric motor 106 drives the transmission 108, and/or whether the internal combustion engine 104 or the transmission 108 drives the electric generator 114.

A speed controller 130 includes a foot pedal 132 that is coupled to the vehicle controller 128. The speed controller 130 provides a signal to the vehicle controller 128 to control the current to the inverter circuit 118 from the electric generator 114.

The inverter circuit 118 is coupled to one or more temperature sensors 120 for monitoring the temperature of the inverter circuit 118. The temperature sensors 120 are coupled to a power limiting control circuit 122. When the temperature sensors 120 detect a temperature in the inverter circuit 118 higher than a predetermined temperature, the power limiting control circuit 122 can limit the power to the inverter circuit 118 in order to prevent exceeding the predetermined operating temperature or reduce the temperature below the predetermined temperature. In an alternate embodiment, a switch can be provided to control current between the electric generator 114 and the inverter circuit 118.

The inverter circuit 118 is further coupled to a heat sink 134 for cooling the inverter circuit 118. The heat sink 134 can be coupled to a radiator 136 such that circulating fluid carries heat away from the heat sink 134. The heat sink 134 can also be cooled by air flowing over the heat sink 134. The vehicle 102 is merely one exemplary arrangement of an IC engine-electric hybrid drive 100. It will be appreciated by those skilled in the art that alternate IC engine-electric hybrid drive vehicles can be provided, with alternate arrangement of components, as well as additional or fewer components.

Figure 2:
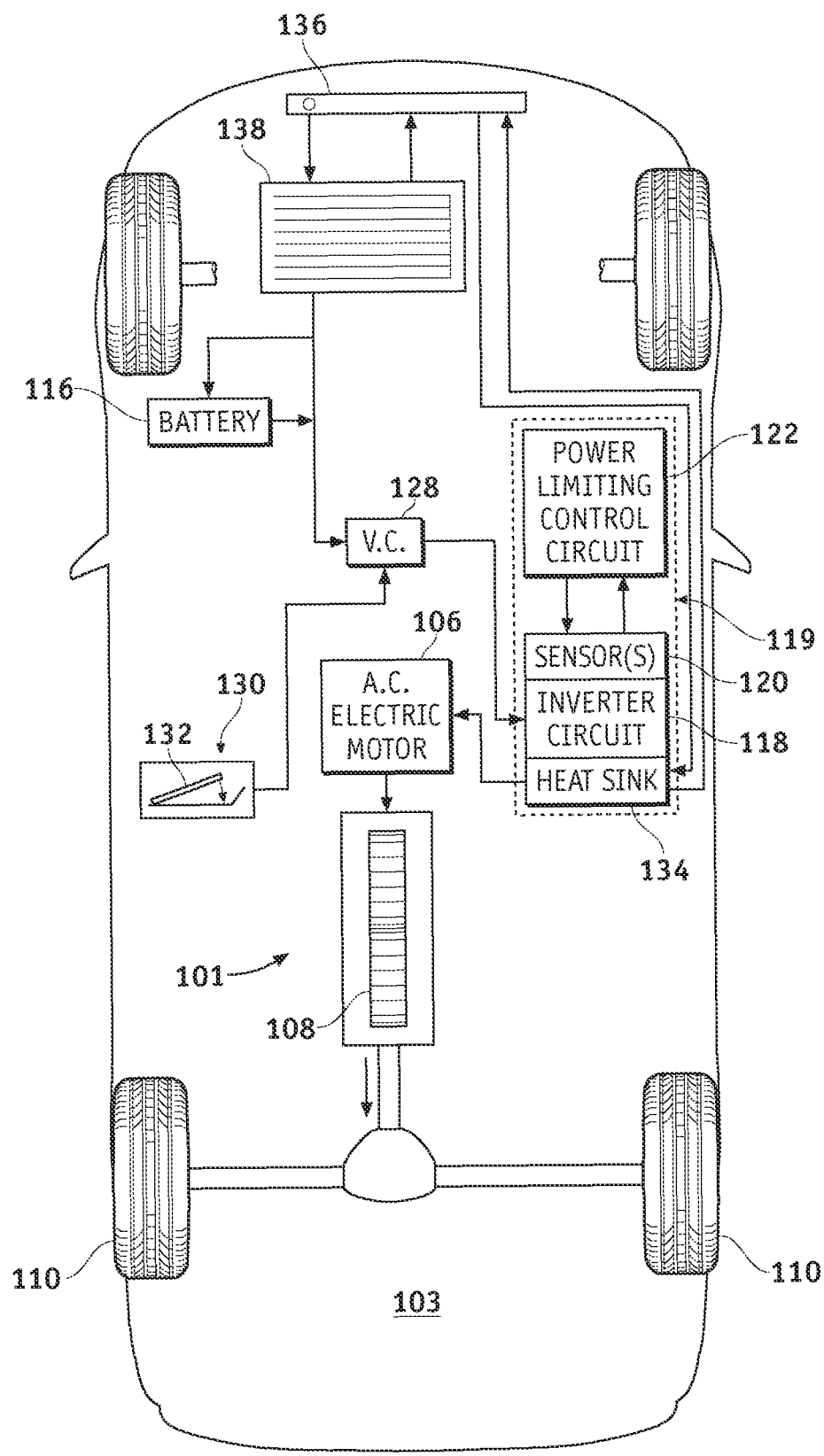
FIG. 2 is a schematic view of an automotive vehicle in accordance with another embodiment of the present invention.

FIG. 2 is a schematic view of a vehicle 103 similar to that of FIG. 1, except that the vehicle 103 includes a fuel cell drive system 101 that utilizes a fuel cell 138 to power the three-phase AC electric motor 106. As in the vehicle 102 of FIG. 1, the transmission 108 is coupled to the AC electric motor 106 for transferring the mechanical output of the AC electric motor 106 to the wheels 110. The inverter circuit 118 that supplies alternating current to the AC electric motor 106. The inverter circuit 118 is coupled to the fuel cell 138 that supplies direct current to the inverter circuit 118. The vehicle controller 128 is disposed between the fuel cell 138 and the inverter circuit 118 for controlling the current to the inverter circuit 118.

As in FIG. 1, the speed controller 130 of FIG. 2 includes the foot pedal 132 that is coupled to the vehicle controller 128. The speed controller 130 provides a signal to the vehicle controller 128 to control the current to the inverter circuit 118 from the electric generator 114.

The inverter circuit 118 of FIG. 2 is coupled to one or more temperature sensors 120 for monitoring the temperature of the inverter circuit 118. The temperature sensors 120 are coupled to a power limiting control circuit 122. When the temperature sensors 120 detect a temperature in the inverter circuit 118 higher than a predetermined temperature, the power limiting control circuit 122 can limit the power to the inverter circuit 118 to prevent exceeding the predetermined operating temperature or reduce the temperature below the predetermined temperature. In an alternate embodiment, a switch can be provided to control current from the fuel cell 138 to the inverter circuit 118.

The vehicle 103 is merely one exemplary arrangement of a fuel cell drive system 101. It will be appreciated by those skilled in the art that alternate fuel cell drive systems can be provided, with alternate arrangement of components, as well as additional or fewer components.

Figure 3:
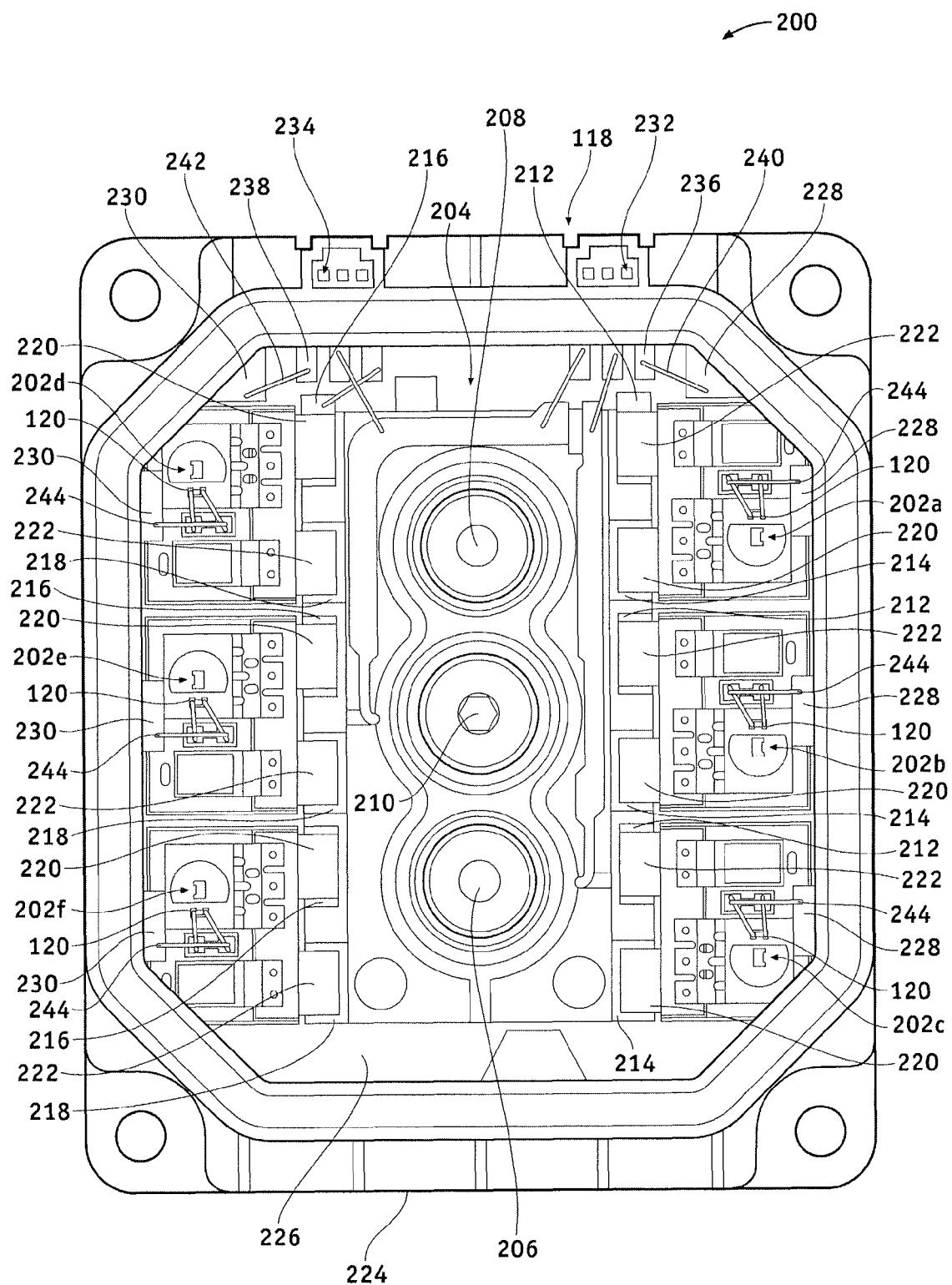
FIG. 3 is a top, plan view of an exemplary of a dual module used in an inverter circuit and a temperature sensor shown in FIGS. 1 and 2 in a switch module.

FIG. 3 is a top, plan view of an exemplary dual module inverter circuit 118 as utilized in the vehicles of FIGS. 1 and 2. The inverter circuit 118 is configured as a switch module 200 having six substrate subassemblies 202a-202f. Other types of inverter modules may be used in place of the illustrated module 200.

The module 200 has a terminal subassembly 204 that includes an emitter terminal 206 for substrate subassemblies 202a, 202b, 202c that form a first substrate subassembly group, a collector terminal 208 for substrate subassemblies 202d, 202e, 202f that form a second substrate subassembly group, and a common collector/emitter terminal 210 for both substrate subassembly groups 202a-c, 202d-f. Terminal subassembly 204 has a first row of coplanar contacts 212, 214 on one side, and a second row of coplanar contacts 216, 218 on the other side. The contact rows 212, 214; 216, 218 are parallel, as are the two groups of substrate subassemblies 202a-c, 202d-f. The contacts 212 are in low electrical resistance communication with emitter terminal 206 while the contacts 216 are in low electrical resistance communication with collector terminal 208. The contacts 214, 218 are also in low electrical resistance communication with collector/emitter terminal 210. Substrate subassembly tabs 220 of substrate subassemblies 202a-202c are welded to terminal subassembly contact areas 214; substrate subassembly tabs 222 of substrate subassemblies 202a-202c are welded to terminal subassembly contact 212; substrate subassembly tabs 220 of substrate subassemblies 202d-202f are welded to terminal subassembly contact areas 216; and substrate subassembly tabs 222 of substrate subassemblies 202d-202f are welded to terminal subassembly contacts 218.

The module 200 has a housing 224 with a heat conductive baseplate 226 having a coefficient of thermal expansion close to that of the substrates in the substrate subassemblies 202a-202f. The cover of housing 224 is not shown to better illustrate the interior construction of the module 200. The housing 224 has two embedded lead frames 228, 230, portions of which are exposed within the module 200 for electrical connection. The housing 224 also has two small connector areas 232, 234 that each include two Kelvin terminals and a gate voltage terminal. The gate voltage terminal for the substrate subassemblies 202a-202c is indicated by reference numeral 236. The gate voltage terminal for the substrate subassemblies 202d-202f is indicated by reference numeral 238. Filamentary wires 240 connect the gate voltage terminal 236 to the embedded lead frame 228, while filamentary wires 242 connect the gate voltage terminal 238 to the embedded lead frame 230. Filamentary wires 244 connect the respective embedded lead frames 228, 230 with each of substrate subassemblies 202a-202f to connect it with the respective gate voltage terminal 236, 238.

Figure 4:
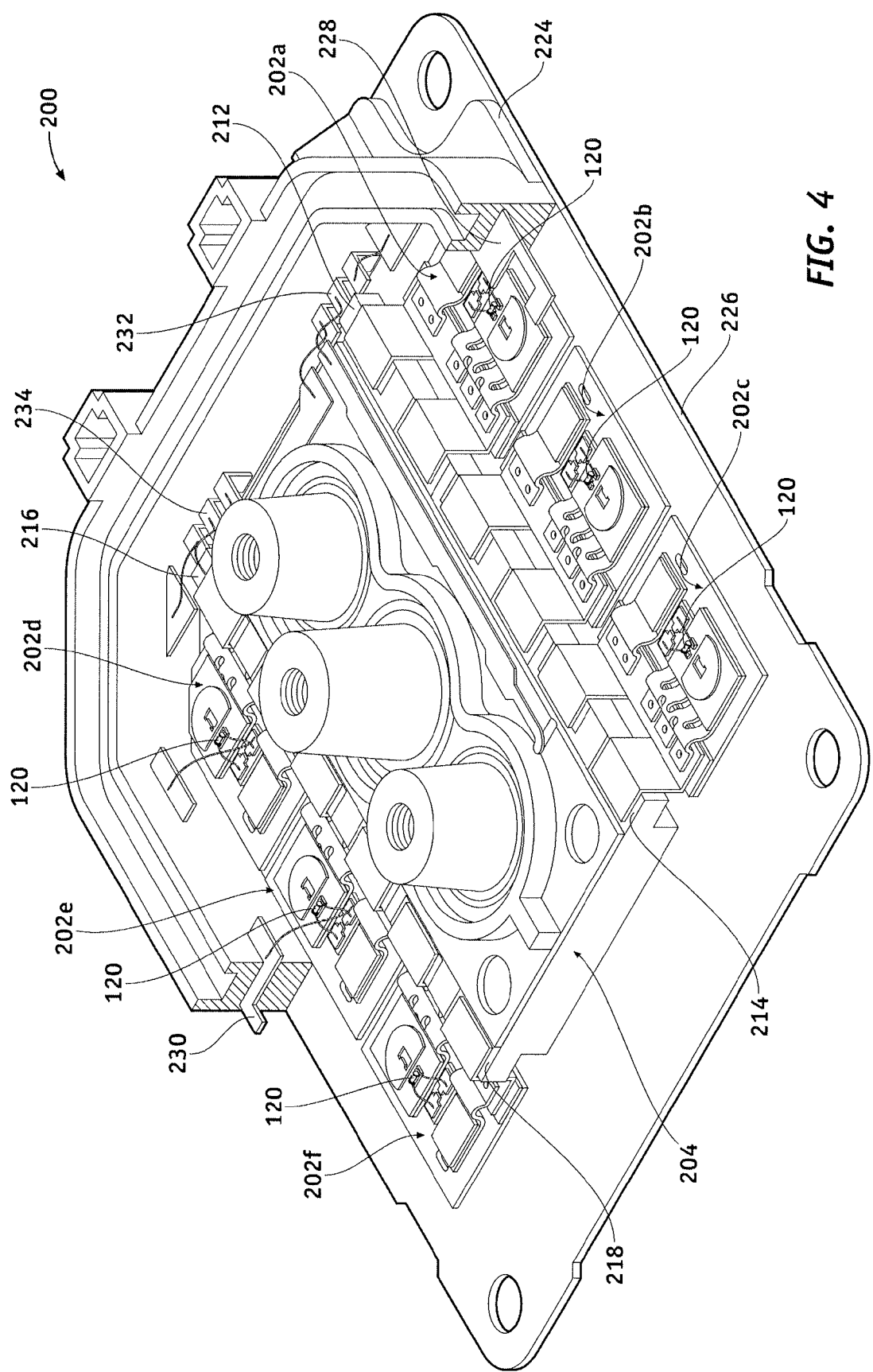
FIG. 4 is a partial isometric view of the module of FIG. 3.

FIG. 4 shows a partial isometric view of the module 200 of FIG. 3. The substrate subassemblies 202a-202f are shown mounted on the baseplate 226. Three substrate subassemblies 202a-202c are soldered to the upper surface of the baseplate 226 on one side of the terminal subassembly 204, while three substrate subassemblies 202d-202f are soldered to the upper surface of the baseplate 226 on the other side of terminal subassembly 204. Each group of three substrate subassemblies 202a-c, 202d-f is disposed along a line parallel to the centerline of terminal subassembly 204. Also, the substrate subassemblies 202a-f are preferably similarly, and symmetrically, disposed on the baseplate 226 to obtain uniformity in cooling, and thereby uniformity in temperature during operation.

Figure 5:
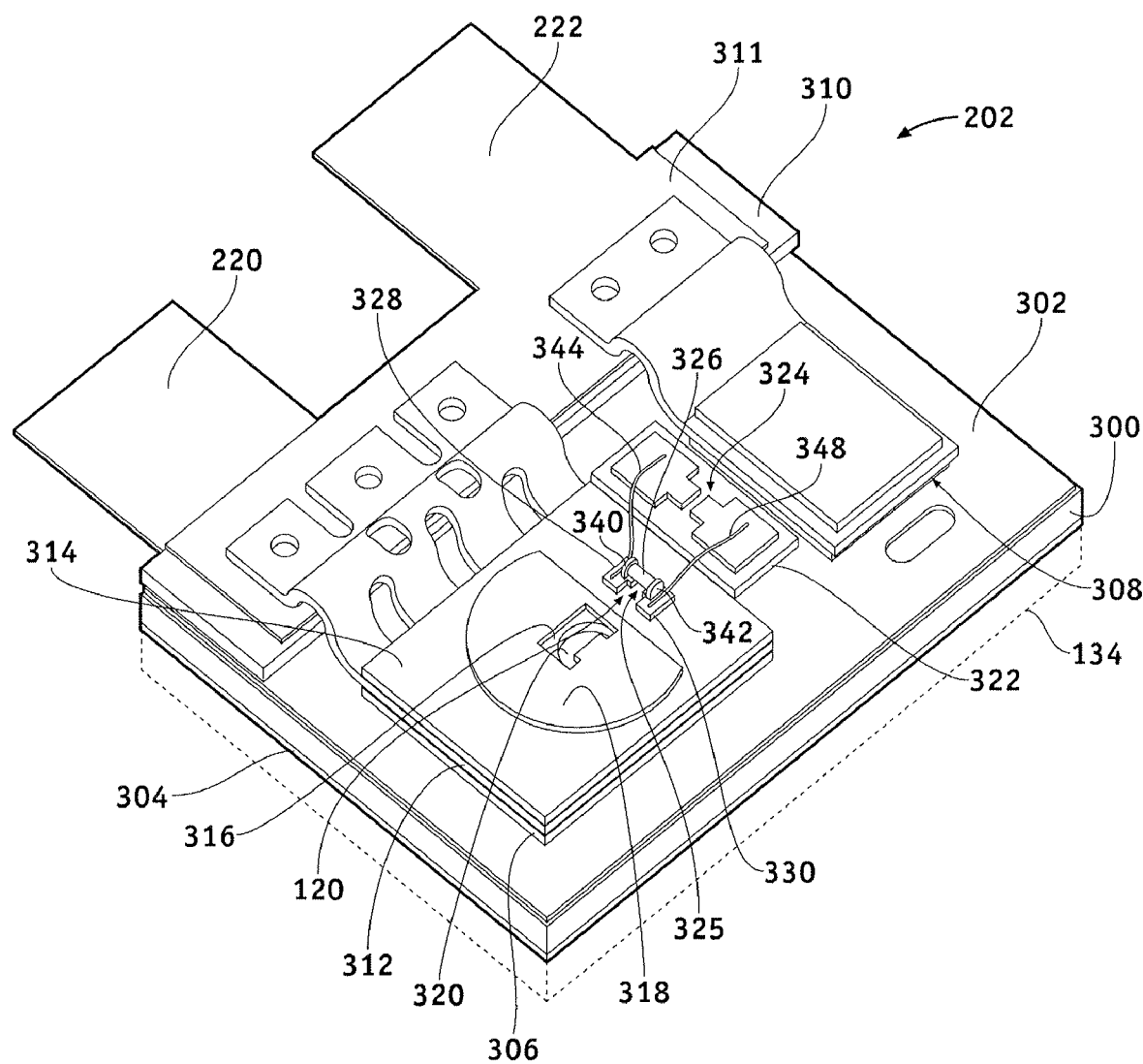
FIG. 5 is an isometric view of a first embodiment of a semiconductor substrate subassembly having a temperature sensor mounted thereon that can be used in the switch module of FIGS. 3 and 4.
Figure 6:
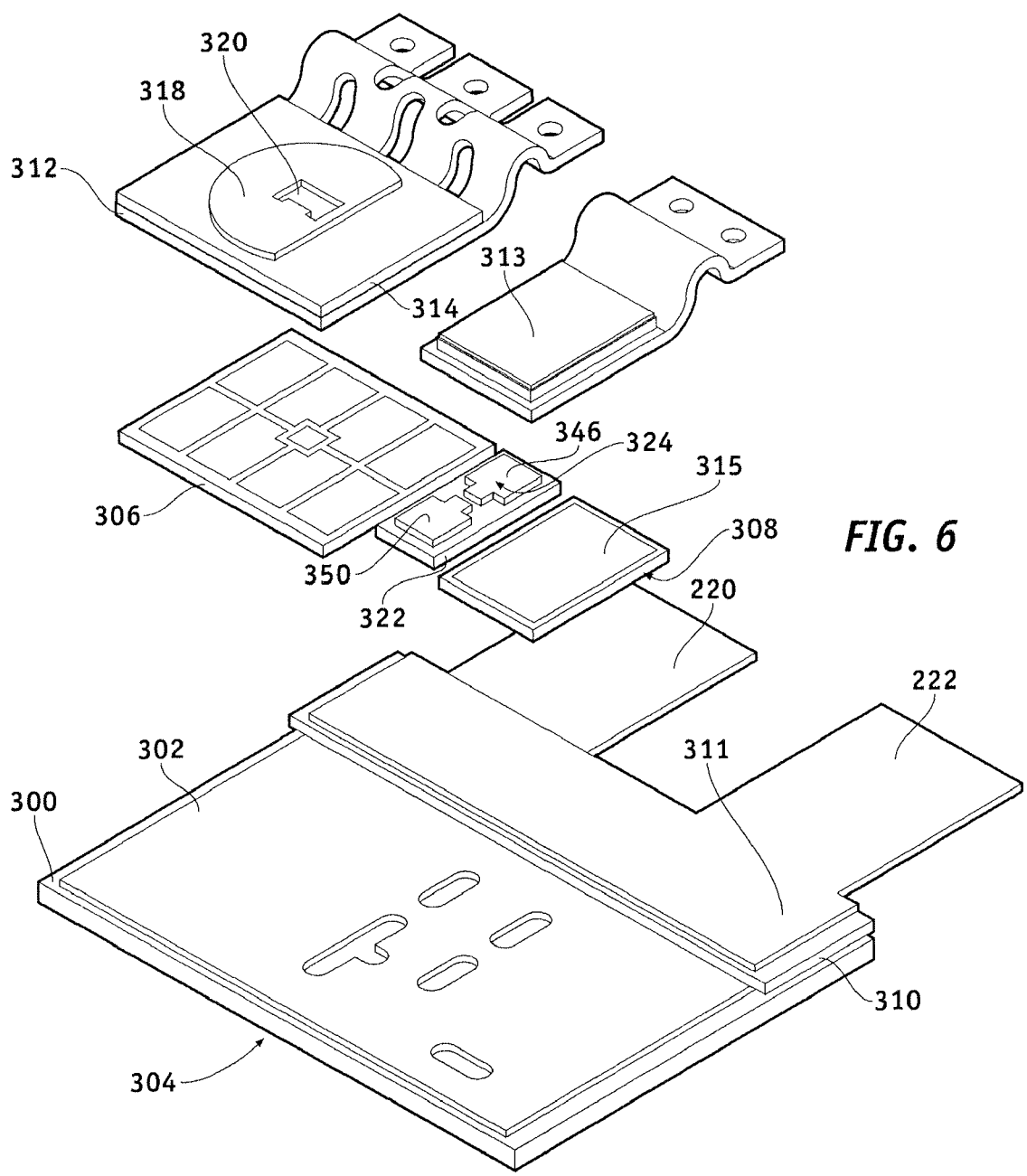
FIG. 6 is an exploded isometric view of the substrate subassembly of FIG. 5.
Figures 7, 8:
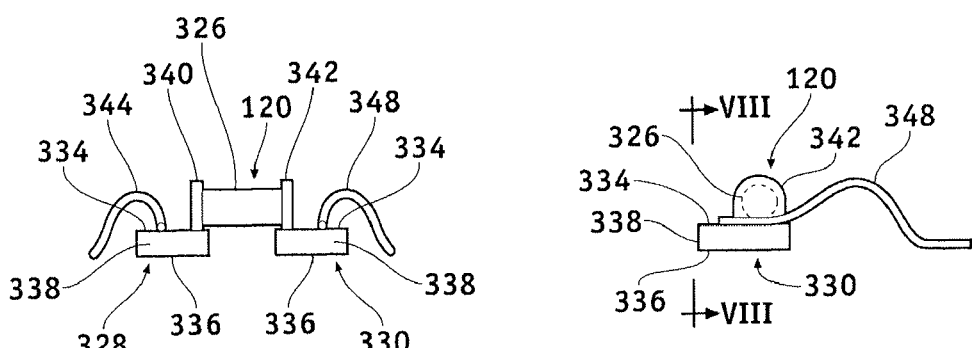
FIG. 7 is an end view of the sensor shown in FIG. 5.
FIG. 8 is a side view of the sensor of FIG. 7 taken along plane VIII-VIII.

FIG. 5 shows one of the IGBT substrate subassemblies 202a-202f (generically referred to as 202) and the temperature sensors 120 represented in FIGS. 1 and 2 in greater detail to provide one embodiment of the invention. FIG. 6 shows the substrate subassembly 202 in an exploded view without the temperature sensor 120 for clarity. FIG. 7 is a closer view of the temperature sensor 120, and FIG. 8 is a cross-sectional view of the temperature sensor 120 of FIG. 7 along plane VIII-VIII.

In the substrate subassembly 202, a wafer 300, which is about 0.5-1 mm thick and about 25 mm long by about 19 mm wide, has metal foil layers 302, 304 bonded to opposite sides thereto. As used herein, the terms bonded, soldered, and attached are used in their broadest sense, and in various embodiments, can be used as interchangeable processes. Larger and smaller wafers can also be provided. The wafer 300 is made of an insulating layer such as beryllium oxide, aluminum oxide, aluminum nitride, silicon nitride or boron nitride, while the foil layers 302, 304 are copper or aluminum having a thickness of about 0.25 mm. Preferably, the foil layers 302, 304 are directly bonded to the wafer 300. The subassembly tab 220 is a unitary portion of the foil layer 302.

A silicon semiconductor switching transistor 306, such as an IGBT or MOSFET, is bonded or adhered to a first portion of the foil layer 302, and a fast silicon semiconductor diode (SFD) 308 is bonded to a second portion of the foil layer 302. The SFD 308 provides a blocking diode across the emitter and collector terminals 206, 208 of the switching transistor 306 and is preferably made of a material substantially similar to the switching transistor 306. In each substrate subassembly 202a-202f (FIGS. 3 and 4), an SFD 308 is paired with a switching transistor 306 and is in close thermal proximity thereto. Depending on the circuit layout, there may be a greater or fewer number of SFDs 308 for every transistor 306. A diode contact area 315 and ceramic wafer 313 form part of the SFD 308. The ceramic wafer 313 may have a metal layer on each side with similar coefficients of expansion to the ceramic wafer 313.

A second, but smaller, ceramic wafer 310 is bonded to the foil layer 302. A third copper foil member 311 is bonded to the ceramic wafer 310 and has the second tab 222 extending therefrom. The second tab 222 is insulated from the first tab 220 by the ceramic wafer 310.

A metallic strip 312 serves as a conductor to contact areas of the switching transistor 306. A ceramic layer 314 having a window 316 is bonded to the metallic strip 312. A D-shaped disk 318 having a contact tab 320 projecting through the window 316 is bonded to the ceramic wafer 314 and is connected to a trimmable resistor mounted on dielectric wafer 322 having a contact pad 324. The metallic strip 312 and the D-shaped disk 318 can be copper, together with the ceramic layer 314 form an interconnect system is more closely matches to the semiconductor 408 coefficient of thermal expansion as compared to conventional interconnects and layers. In other embodiments, the D-shaped layer 318 can be replaced with a metal layer approximately the same size as the ceramic layer 314.

As is seen in FIG. 5 in combination with FIGS. 7 and 8, the temperature sensor 120 is comprised of a thermistor 326 that is soldered to a pair of foil bases 328, 330 that are, in turn, attached to the ceramic layer 314. The terms base and pad can be used interchangeably. The foil bases 328, 330 are metal interconnects, each having a conductive surface 334 of foil copper or aluminum deposit, and a conductive surface 336 of foil copper or aluminum deposit. In an alternate embodiment, the thermistor 326 can be replaced with a thermocouple.

The thermistor 326 has a conductive flange 340 at one end soldered to the conductive surface 334 of the foil base 328 and a conductive flange 342 at the other end soldered to the outer conductive surface 334 of foil base 330. A first conductive lead 344 in the form of a filamentary wire is soldered or ultrasonically bonded to the conductive surface 334 of the foil bases 328 and to the contact pad 324. A second conductive lead 348 in the form of a filamentary wire is soldered or ultrasonically bonded to the conductive surface 334 of the foil base 330 and to the contact pads 324 of the trimmable resistor 322. Leads from the thermistor 326 are connected to the power limiting control circuit 122 (see FIGS. 1 and 2). In alternate embodiments, the foil bases 328 and 330 can be metallized ceramic interconnects.

Figure 9:
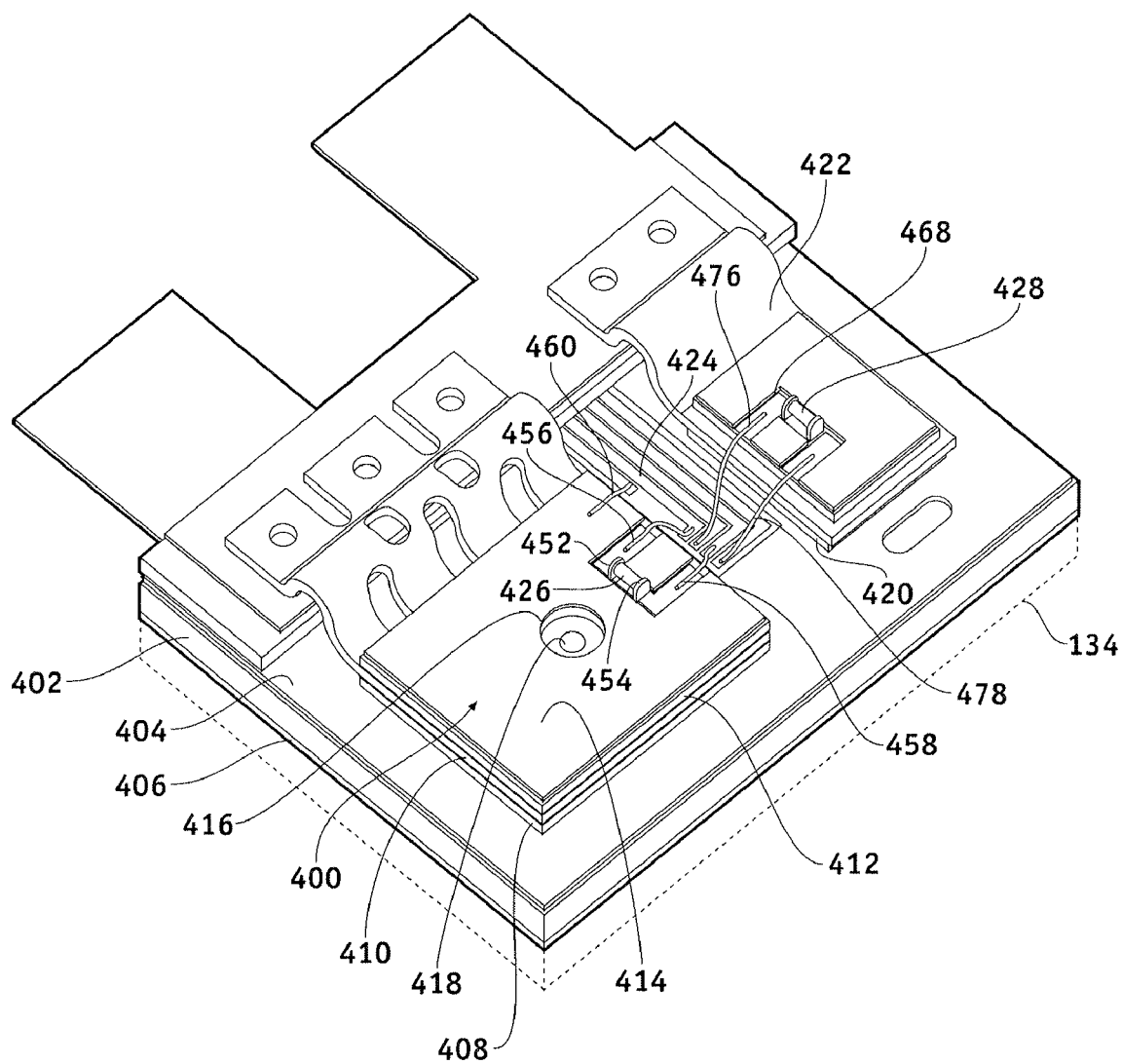
FIG. 9 is an isometric view of a second embodiment of an IGBT semiconductor substrate subassembly used in a switch module of the type shown in FIGS. 3 and 4.
Figure 10:
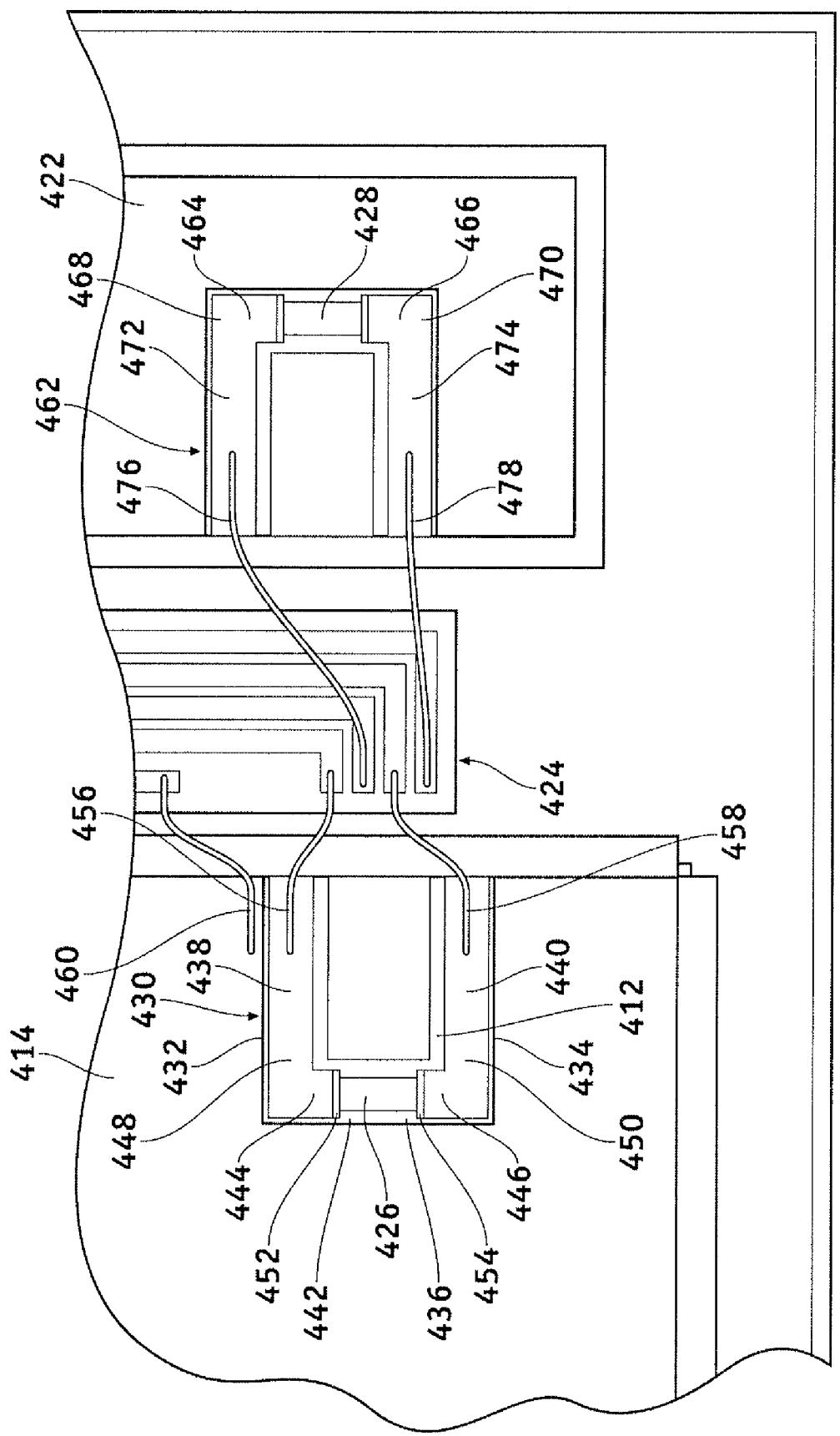
FIG. 10 is a top view of a portion of FIG. 9.

FIG. 9 shows a second embodiment of the heat sensing arrangement with elements similar to that shown in FIGS. 5-8. The switching semiconductor in FIG. 9 is configured as an IGBT die 400. Reference is additionally made to FIG. 10 that shows a closer view of a portion of the IGBT die 400 of FIG. 9.

The IGBT die 400 is comprised of an oxide or nitride wafer 402, such as a beryllia wafer, which is metallized on an upper surface by a copper foil plate 404 and on a lower surface by a copper foil plate 406. A silicon semiconductor switching transistor 408 is soldered to the foil 404, and a first metal layer 410, such as copper or aluminum, serves to contact areas of the switching transistor chip 408. A ceramic layer 412 is attached to the first metal layer 410, and a second metal layer 414 is attached to the ceramic layer 412. The second metal layer 414 serves to balance the lay up of the ceramic layer 412 and first metal layer 410 to prevent warping and additional stresses to semiconductor switching transistor 408. The second metal layer 414 has a window 416 that is aligned with a hole 418 through the ceramic layer 412 for contact access to the switching transistor 408.

A diode 420 is mounted laterally with respect to the IGBT die 400 and has a top copper layer 422. Between the IGBT die assembly 400 and the diode 420 are traces 424 extending over the copper layer 404 to the power limiting control circuit 122 (see FIGS. 1 and 2) for interrupting or reducing current to the inverter circuit 118 (see FIGS. 1 and 2). Each trace represented by reference number 424 can be unique for the temperature sensing circuit and gate signal 460.

The temperature of the IGBT die 408 and diode 420 are measured with temperature sensors 426, 428, respectively. In a preferred embodiment, temperature sensors 426, 428 are thermistors but the temperature sensors 426, 428 can alternatively be thermocouples, or other temperature sensing device.

The temperature sensor 426 is mounted on two L-shaped traces 438 and 440 in the second metal layer 414 of the 400. The U-shaped opening 430 has legs 432, 434 separated by a bight 436. The L-shaped traces 438 and 440 are spaced apart from one another by a gap 442. The L-shaped traces 438 and 440 have short legs 444 and 446 and long legs 448 and 450. The short legs 444 and 446 are soldered or bonded to end flanges 452 and 454 on the temperature sensor 426 while the long legs 448 and 450 have thin wire leads 456 and 458 soldered or ultrasonically bonded to the traces 424 that are connected to the power limiting control circuit 122 (see FIGS. 1 and 2). When the temperature of the IGBT die 400 exceeds a predetermined level, the power limiting control circuit 122 (FIGS. 1 and 2) interrupts or limits current to the IGBT die 400. A separate thin wire lead 460 connects the foil layer 414 to the traces 424, for example, to transfer the gate signal of the IGBT die 400.

The diode 420 also has a U-shaped opening 462 in the foil layer 422 so that the temperature sensor 428 can directly monitor the temperature of the diode 420. Like the temperature sensor 426 on the IGBT die 400, the temperature sensor 428 is soldered or bonded to short legs 464 and 466 of pair of L-shaped traces 468 and 470. Long legs 472 and 474 have first ends of thin wire leads 476 and 478 soldered or ultrasonically bonded thereto, with second ends of the leads bonded to the traces 424 which are connected to the power limiting circuit 122 (see FIGS. 1 and 2).

The temperature level at which current is interrupted is in the range of about 125° C. to about 175° C. and preferably about 150° C. Generally and as an example, the maximum operating temperature of silicon is about 175°. However, due to manufacturing variability and tolerance, the power limiting control circuit 122 of one embodiment of the present invention prevents the temperature from exceeding 150°. Other embodiments may include silicon and other materials rated for higher temperatures, for example, greater than 200° C. and greater than 300° C.

In accordance one embodiment of the invention, the temperatures of the inverter circuits 118 are sensed on one side, i.e., the top sides, and the inverter circuits 118 are cooled on the bottom sides. Cooling is accomplished by the heat sink 134 shown in dotted lines in FIGS. 1-2, 5 and 9. The heat sink 134 are preferably cooled by fluid, which in one embodiment is air and in another embodiment, recirculated liquid. The liquid may be sprayed and recovered either before or after evaporation or may flow past the inverters in a liquid state and cooled by the radiator 136 of FIGS. 1 and 2.

In another embodiment, the inverter circuit 118 illustrated in FIGS. 1 and 2 can be a plurality of IGBT dies and diodes mounted on a single substrate. Temperature sensors can be provided on one or more of the IGBT dies and diodes. Moreover, although an inverter circuit 118 has been described, in alternate embodiments, the temperature sensors 120 can be mounted on any type of power electronic device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A substrate subassembly comprising:
   a ceramic wafer having first and second opposed metallized major faces;
   a first metal tab on the first metallized face that extends away from the ceramic wafer for electrical connection to a first terminal member;
   a semiconductor switching device electrically conductively bonded to the first metallized face of the ceramic wafer, wherein the semiconductor switching device includes electrodes on a first surface;
   a first ceramic layer bonded to a portion of the first metallized face of the ceramic wafer adjacent the semiconductor switching device, the first ceramic layer having a metallized first surface;
   a second metal tab on the metallized first surface of the first ceramic layer that extends away from the ceramic wafer for electrical connection to a second terminal member;
   a first metal layer conductively bonded to the electrodes on the first surface of the semiconductor switching device and also to the metallized first surface of the first ceramic layer;
   a second ceramic layer bonded to the first metal layer, the second ceramic layer being disposed over the semiconductor switching device;
   a second metal layer bonded to the second ceramic layer, wherein the first metal layer, the second ceramic layer, and the second metal layer form an interconnect that approximately matches a thermal coefficient of expansion of the semiconductor switching device; and
   a temperature sensor coupled to the semiconductor switching device, the temperature sensor configured to measure the temperature of the semiconductor device.

2. The substrate subassembly of claim 1, wherein the semiconductor switching device is an IGBT.

3. The substrate subassembly of claim 1, wherein the temperature sensor is a thermistor.

4. The substrate subassembly of claim 1, wherein the temperature sensor is bonded to the second metal layer.

5. The substrate subassembly of claim 1, wherein the temperature sensor is bonded to the second ceramic layer.

6. The substrate subassembly of claim 1, further comprising a diode disposed adjacent to the semiconductor switching device, and an additional temperature sensor coupled to the diode.

7. The substrate subassembly of claim 1, further comprising a power control circuit electrically connected to the temperature sensor and configured to control DC current to the semiconductor switching device, the power control circuit configured to reduce current to the semiconductor switching device when the temperature of the semiconductor switching device exceeds a predetermined temperature.

8. The substrate subassembly of claim 7, wherein the predetermined temperature is about 150° C.

9. The substrate subassembly of claim 7, wherein the power control circuit is configured to reduce the current to the semiconductor switching device to substantially zero when the temperature exceeds the predetermined temperature.

10. The substrate subassembly of claim 7, further comprising first and second bases mounting the temperature sensor onto the semiconductor switching device and spaced at a distance from one another, the temperature sensor bridging the two bases.

11. The substrate subassembly of claim 7, further comprising a diode disposed adjacent to the semiconductor switching device, and the predetermined temperature of the semiconductor switching device being a first predetermined temperature, and
   wherein the system further comprises an additional temperature sensor mounted on the diode and connected to the control circuit for reducing current to the semiconductor switching device when the diode exceeds a second predetermined temperature.

* * * * *